United States Patent
Hsu et al.

(10) Patent No.: US 7,081,491 B2
(45) Date of Patent: Jul. 25, 2006

(54) METHOD FOR FABRICATING POLYBENZOXAZOLE/CLAY NANOCOMPOSITE MATERIALS

(75) Inventors: Steve Lien-Chung Hsu, Tainan (TW); Keng-Chuan Chang, Kaohsiung (TW)

(73) Assignee: National Cheng-Kung University, Tainan (TW)

( * ) Notice: Subject to any disclaimer, the term of this patent is extended or adjusted under 35 U.S.C. 154(b) by 341 days.

(21) Appl. No.: 10/316,214

(22) Filed: Dec. 9, 2002

(65) Prior Publication Data
US 2003/0139513 A1    Jul. 24, 2003

(30) Foreign Application Priority Data
Dec. 10, 2001    (TW) ............... 90130496 A

(51) Int. Cl.
*C08K 3/34*    (2006.01)
*C08G 61/12*    (2006.01)

(52) U.S. Cl. ............ 524/445; 524/447; 524/186; 501/145; 528/86

(58) Field of Classification Search ........... 524/445, 524/447, 186; 501/145; 528/86
See application file for complete search history.

(56) References Cited

U.S. PATENT DOCUMENTS

| | | | |
|---|---|---|---|
| 5,270,432 A * | 12/1993 | Hergenrother et al. | 528/128 |
| 5,322,916 A * | 6/1994 | O'Brien et al. | 528/183 |
| 5,747,560 A * | 5/1998 | Christiani et al. | 523/209 |
| 6,410,156 B1 * | 6/2002 | Akkapeddi et al. | 428/476.1 |
| 2005/0032937 A1 * | 2/2005 | Tsou et al. | 523/216 |

OTHER PUBLICATIONS

Hsu, S. L. C, Chang, K. C., "Synthesis and Properties of Polybenzoxazole-Clay Nanocomposites" Polymers 43(2002) 4097-4101.*

Chang, J. H., Park D. K., Ihn K. J., Montmorillonite Based Nanocomposites of Polybenzoxazole: Synthesis and Characterization (I) Journal of Polymer Science: Part B: Polymer Physics, vol. 39, 471-476 (2001).*

Morrison and Boyd Organic Chemistry fifth Edition, 1987 by Allyn and Bacon pp. 857, 860, 861 and 864.*

* cited by examiner

*Primary Examiner*—Tae H. Yoon

(57) ABSTRACT

A method for fabricating a polybenzoxazole/clay nanocomposite material includes performing an ion exchange reaction between an organic amine and $Na^+$-montmorillonite to form a swelled organoclay. A polycondensation reaction is conducted between two types of monomers, isophthaloyl chloride and 2,2-bis (3-amino-4-hydroxyphenyl) hexafluoropropane to form a polybenzoxaxole precursor polyhydroxyamide to form a PBO/clay composite material.

25 Claims, 7 Drawing Sheets

METHOD FOR FABRICATING POLYBENZOXAZOLE/CLAY NANOCOMPOSITE MATERIALS

CROSS-REFERENCE TO RELATED APPLICATION

This application claims the priority benefit of Taiwan application serial no. 90130496, filed on Dec. 10, 2001.

BACKGROUNDING OF THE INVENTION

1. Field of Invention

The present invention relates to a method for fabricating a nanocomposite material. More particularly, the present invention relates to a method for fabricating a polybenzoxazole (PBO)/clay nanocomposite material.

2. Description of Related Art

Polybenzoxazoles (PBOs) are a class of polymers that have excellent thermal stability, high mechanical strength and chemical resistance. The general molecular structure of PBOs is shown in the following:

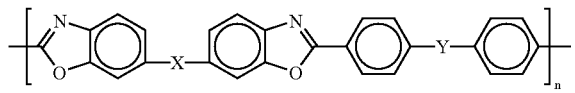

wherein X, Y can be O, $C(CF_3)_2$, $C(CH_3)_2$, CO, etc. These properties of PBOs are similar to those polymers with high thermal resistance, such as, polyimides. Unlike polyimides, PBOs do not possess a polar carbonyl group. Therefore, PBOs have low water absorption and a low dielectric constant. These special attributes allow PBOs to be more applicable in the microelectronic industry, for example, as buffer coatings in IC chip, interlayer dielectrics for multichip modules (MCM-D), substrates for flexible printed circuit board, tape automatic bonding material and high-end electronic packaging materials.

However, similar to other polymeric materials in general, the thermal expansion coefficient of PBOs is higher than that of the organic materials or metallic materials (such as, silicon chip, copper foil, etc.). Due to the mismatch in the thermal expansion coefficients, when PBOs are used with the above materials, the generation of thermal stress would cause warpage and cracking in the products. The current approach in addressing the problem of high thermal expansion coefficient of PBOs involves using molecular design to adjust the molecular structure of PBOs. However, the aforementioned conventional method involves the synthesis of new monomers, which is expensive and time-consuming.

SUMMARY OF THE INVENTION

Accordingly, the present invention provides a method for fabricating a polybenzoxazole (PBO)/clay nanocomposite material, wherein the thermal expansion coefficient of PBO is lower.

The present invention also provides a fabrication method for a PBO/clay nanocomposite material, wherein the desirable attributes of PBOs and the high reinforcement effect of a nanocomposite material are combined to generate a high quality and functional polymer material that is applicable to microelectronic products.

The present invention also provides a fabrication method for a PBO/clay composite material, wherein the thermal decomposition temperature and the glass transition temperature increase as the amount of the added clay increases to increase the thermal stability of the polymer.

Accordingly, the present invention provides a fabrication method for a PBO/clay nanocomposite material, wherein the fabrication method comprises using an amine type modifying agent and a layered clay, for example, a $Na^+$-montmorillonite clay to perform an ion exchange reaction to form a swelled organoclay. Further reacting two types of monomers, for example, isophthaloyl chloride with 2,2-bis(3-amino-4-hydroxyphenyl) hexafluoroproane, (BisAPAF), by a polycondensation reaction to form a soluble precursor of polybenzoxazole, wherein the precursor is, for example, a polyhydroxyamide (PHA), having an inherent viscosity of about 0.5 dL/gm. After mixing different ratios of the organoclay with the PBO precursor, the mixture is then subjected to a high temperature cyclization reaction to form a PBO/clay nanocomposite material.

One advantage of the present invention is the nano-dispersion of the organoclay in the PBO matrix. Due to the high surface to volume ratio of the nano-dispersed clay, the thermal expansion and contraction of polymer molecules are highly restricted, which can reduce their thermal expansion coefficient effectively.

Moreover, the PBO material formed according to the present invention has a lower water absorption, a lower dielectric constant, a higher thermal stability, a higher mechanical strength and chemical resistance, and a high reinforcement effect of a nanocomposite material in order to form a high quality and functional polymer material.

Experimental results further confirmed that the thermal decomposition temperature and the glass transition temperature ($T_g$) of the nanocomposite material formed according to the present invention increase as the amount of the added clay increases. The thermal stability of the PBO/clay nanocomposite material thus increases.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
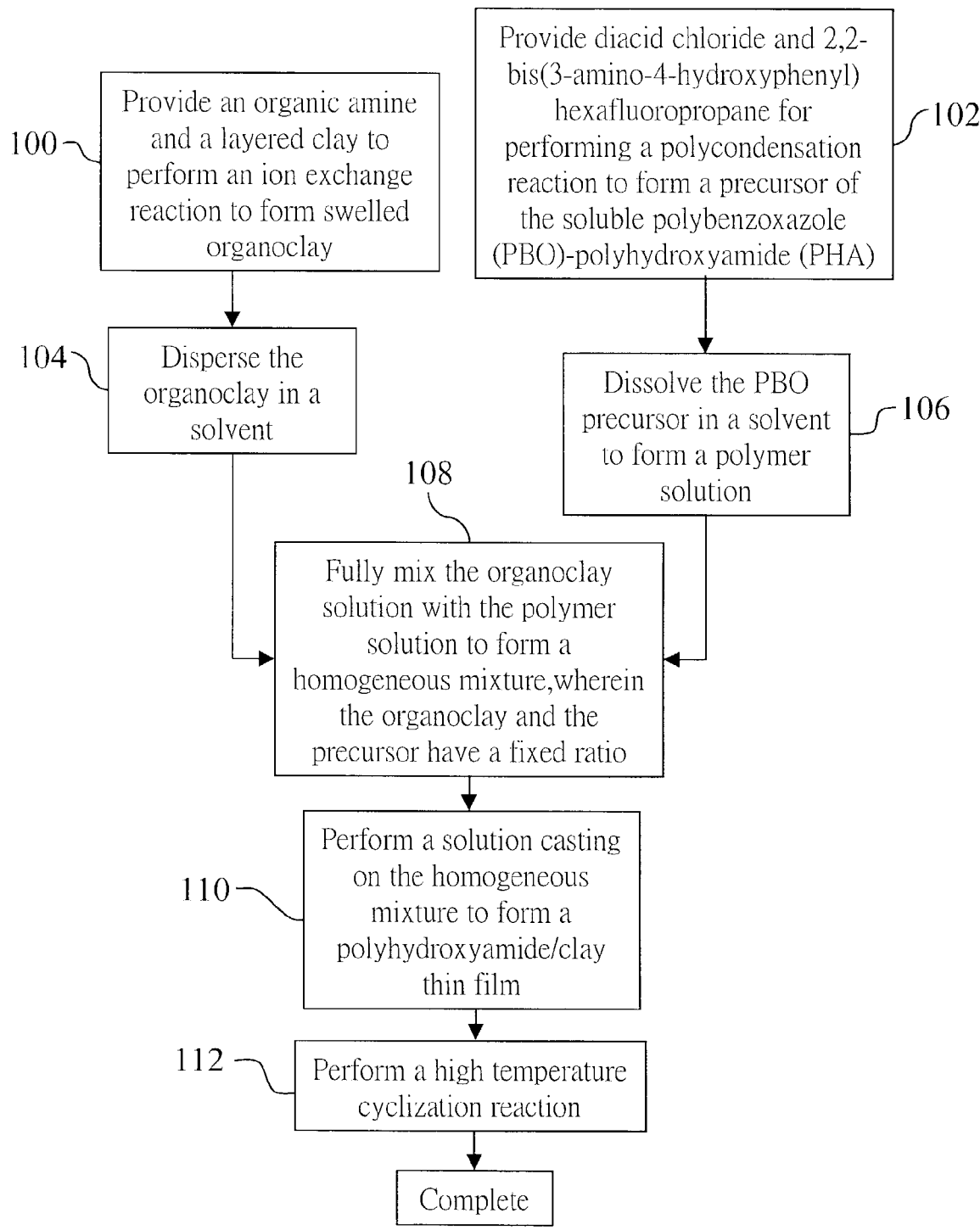
FIG. 1 is a flow diagram illustrating the fabrication process for a polybenzoxazole (PBO)/clay nanocomposite according to one aspect of the present invention.

FIG. 1 is a flow chart illustrating the fabrication process of a polybenzoxazole (PBO)/clay nanocomposite material according to one aspect of the present invention.

Referring to FIG. 1, the fabrication process for a PBO/clay nanocomposite material comprises: step 100, wherein an ion exchange reaction, for example, a cation exchange reaction, is conducted between an organic amine type modifying agent and a layered clay to form a swelled organoclay. The organoclay is formed by treating layered clay, such as, a Na+-montmorillonite clay, with an ammonium salt of dodecylamine (DOA). The reaction is shown in the following:

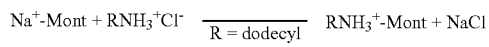

Further, the layered clay can also be, for example, saponite, mica, etc. The modifying agent can be organic amine of different structures, for example, dodecylamine, phenoxyaniline or 12-aminododecanoic acid.

Thereafter, in step 102, the diacid chloride of isophthaloyl chloride (IC) and 2,2-bis-(3-amino-4-hydroxyphenyl) hexafluoroproane (BisAPAF) are provided to perform a polycondensation reaction to form, for example, polyhydroxyamide (PHA), a soluble precursor of the PBO.

The solvent used in the polycondensation reaction includes, for example, N-methyl-2 pyrrolidinone (NMP) solvent or other polar solvents. The reaction temperature is between 0~5° C. The inherent viscosity of the soluble PBO precursor is between 0.1 dL/gm~3.0 dL/gm (measured using Cannon-Ubbelohde Viscometer at a concentration 0.5 gm/dl and at 30° C.). Further, different structures of the diacid chloride and the bis(o-aminophenol) can be used as monomers of the PBO precursor, wherein bis(o-aminophenol) includes, for example, 3,3'-dihydroxy-benzidine, 3,3'-diamino-4,4'-dihydroxy biphenyl; while diacid chloride includes, for example, terephthaloyl chloride or 4,4'-oxydibenzoylchloride.

Thereafter, in step 104, the organoclay is dispersed in, for example, a dimethyl acetamide (DMAc) solvent or other polar solvent. However, in step 106, PHA, the precursor of PBO, is dispersed in a DMAc polar solvent to form a polymer solution.

Continuing to step 108, the organoclay suspension is fully mixed with the PHA polymer solution to form a homogeneous mixture, wherein the organoclay and the precursor of PBO, for example, PHA, are in a fixed ratio, for example, between 0.001 to 0.5, preferably between 0.01 to 0.1.

Thereafter, as shown in step 110, a solution casting is performed on the homogeneous mixture to form a PHA/clay film. Further, other polymers, such as, polyamide or polyimide, and other additives, such as, anti-static agent, molding compound and colorant, can also be added.

Further, in step 112, a high temperature cyclization reaction is performed to form the PBO/clay composite material, wherein in the high temperature cyclization reaction, the PHA/clay film formed in step 110 is subjected to a temperature of about 350 degrees Celsius for about 1 hour.

The two-steps reaction in producing PBO as discussed in the above 102, 108, 110 and 112 steps is shown in the following scheme:

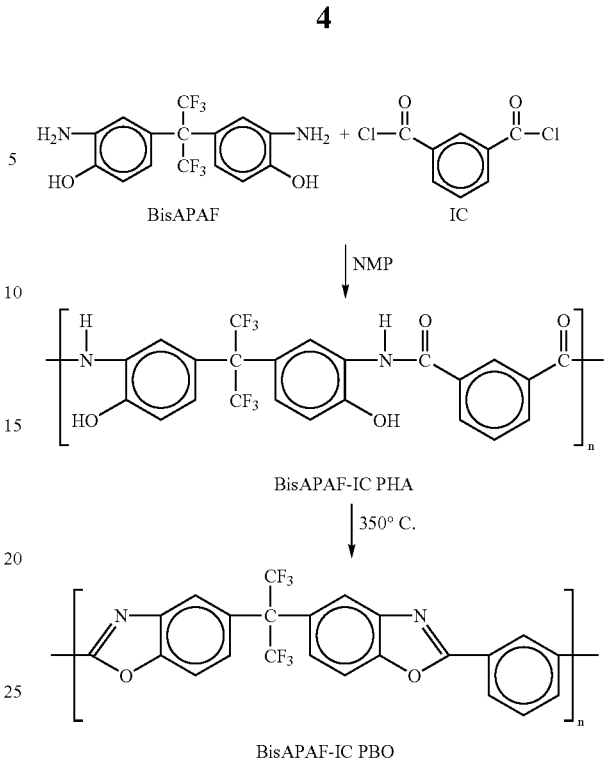

FIGS. 2 to 7 detail the characteristic changes of the materials in the aforementioned processing steps of the present invention.

In accordance to the present invention, an ion exchange reaction is performed between an organic amine and a layered clay to form a swelled organoclay. The hydrophilic clay is converted to a hydrophobic clay to facilitate its dispersion in the organic polymer material. The X-ray diffraction spectra for a swelled organoclay and an untreated clay are shown in FIG. 2, respectively.

Figure 2:
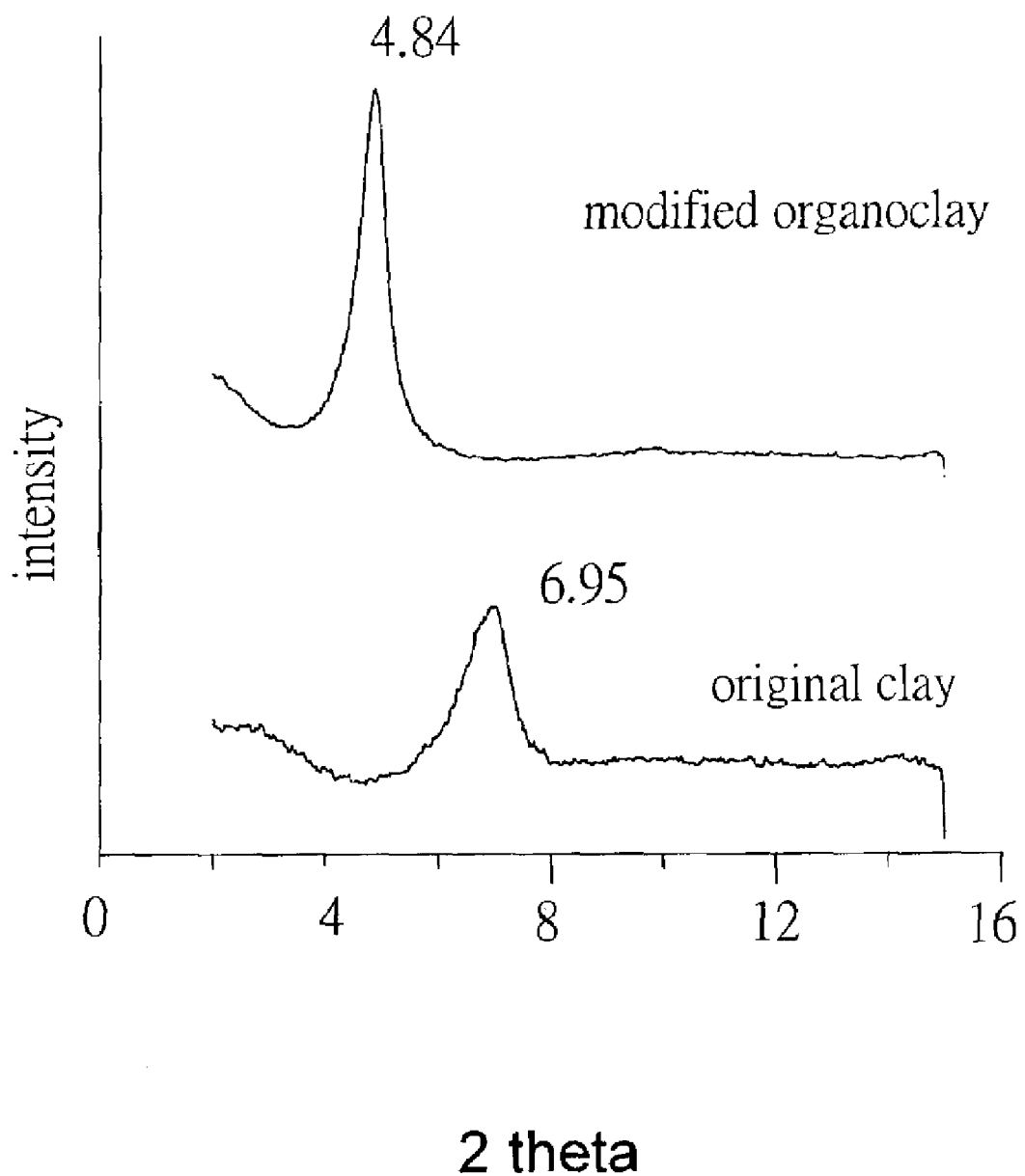
FIG. 2 illustrates the X-ray diffraction spectra for a swelled organoclay and an untreated clay, respectively.

As shown in FIG. 2, the curve for the treated organoclay has a peak at 2θ=4.84°, which corresponds to an interlayer spacing of about 18.1 Å. The curve for the original untreated clay has a peak at 2θ=6.95°, which corresponds to an interlayer spacing of about 12.7 Å. Based on the results from X-ray diffraction, the interlayer spacing is increased by the modifying agent, which help the polymer molecules to intercalate the clay.

Figure 3:
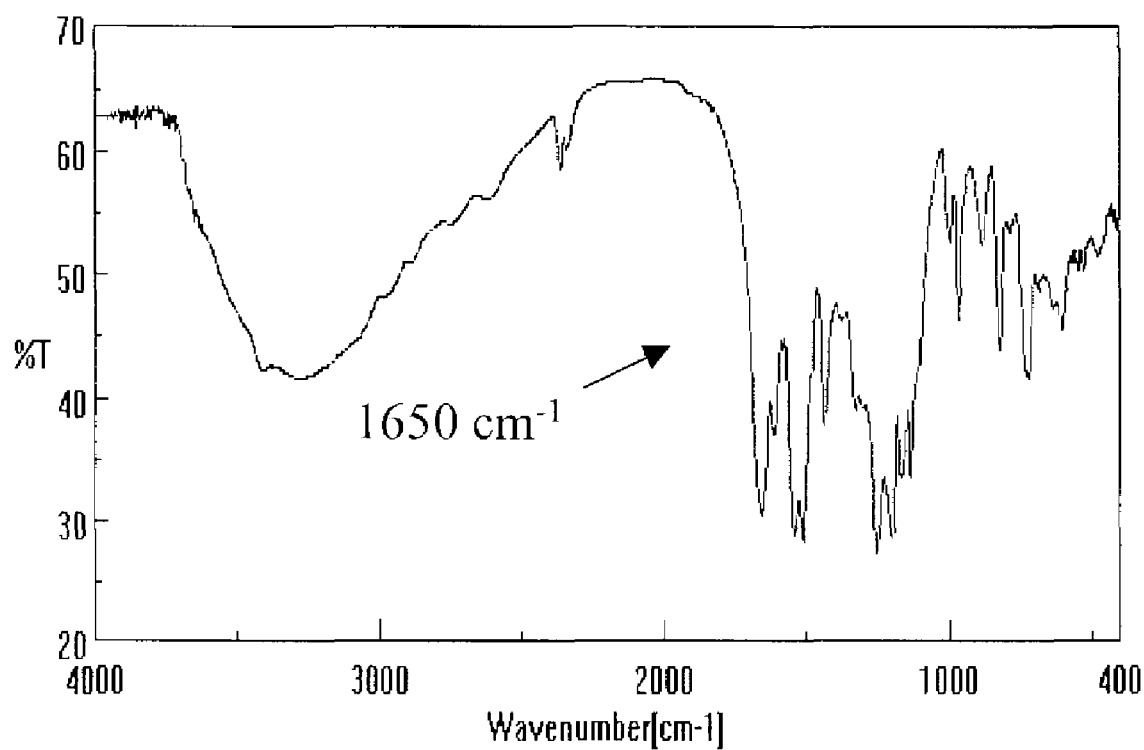
FIG. 3 is a FTIR spectrum of a soluble PBO precursor, polyhydroxamide (PHA)

The Fourier Transform Infrared spectrum (FTIR spectrum) of the soluble precursor of PBO-PHA is shown in FIG. 3. As shown in FIG. 3, the polymer exhibits a broad absorption band at 3400~3100 $cm^{-1}$ due to the OH-group and the NH group and a strong carbonyl absorption of the C=O group of amide group at 1650 $cm^{-1}$.

Figure 4:
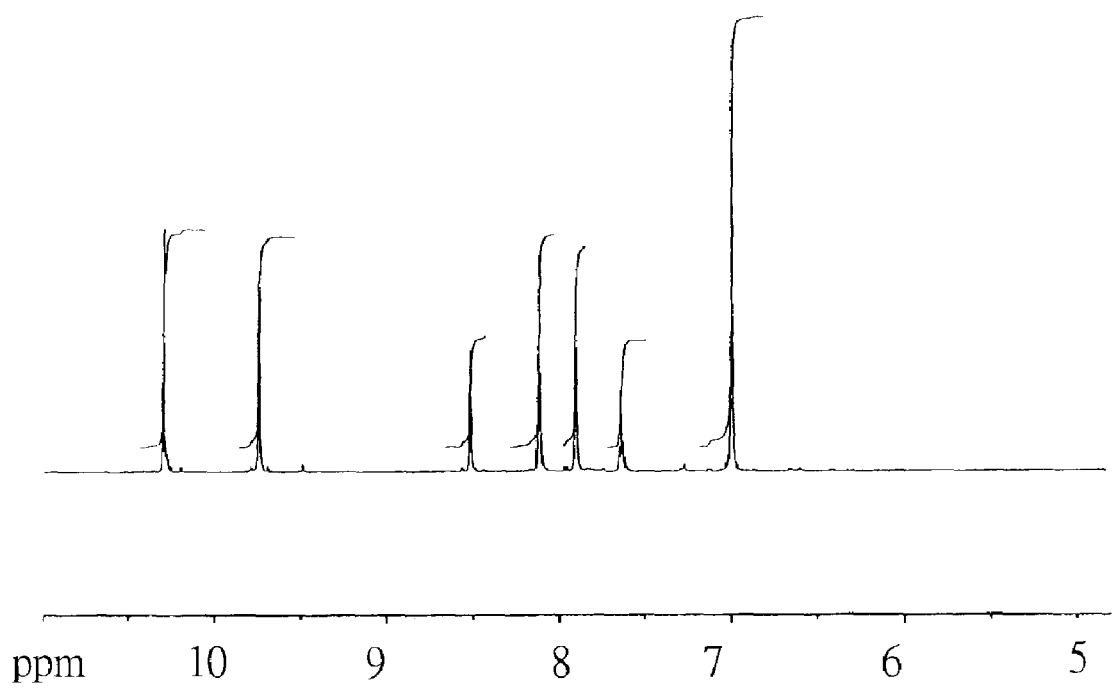
FIG. 4 is a $^1$H-NMR spectrum for a soluble PBO precursor, polyhydroxamide (PHA)

Further, the absorption peaks of the OH group (δ=10.4) and the NH group (δ=9.8) in the PHA, the precursor of the PBO, also visible in the $^1$H-NMR spectrum as shown in FIG. 4.

Figure 5:
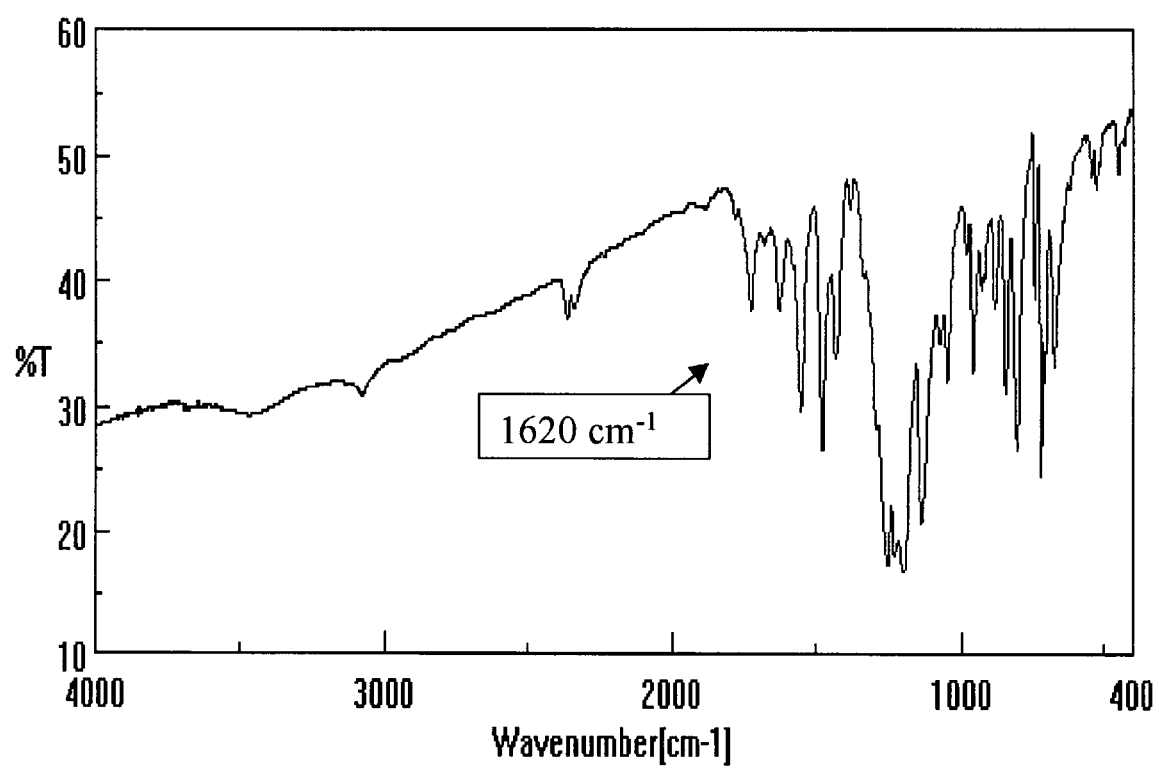
FIG. 5 is a FTIR spectrum for polybenzoxazole after cyclyzation.

As shown in the FTIR spectrum in FIG. 5, subsequent to the dehydrative cyclization of PHA, the absorption peak (1650 $cm^{-1}$) of the C=O group of amide disappears and the characteristic absorption peak of PBO (1620 $cm^{-1}$) appears.

Figure 6:
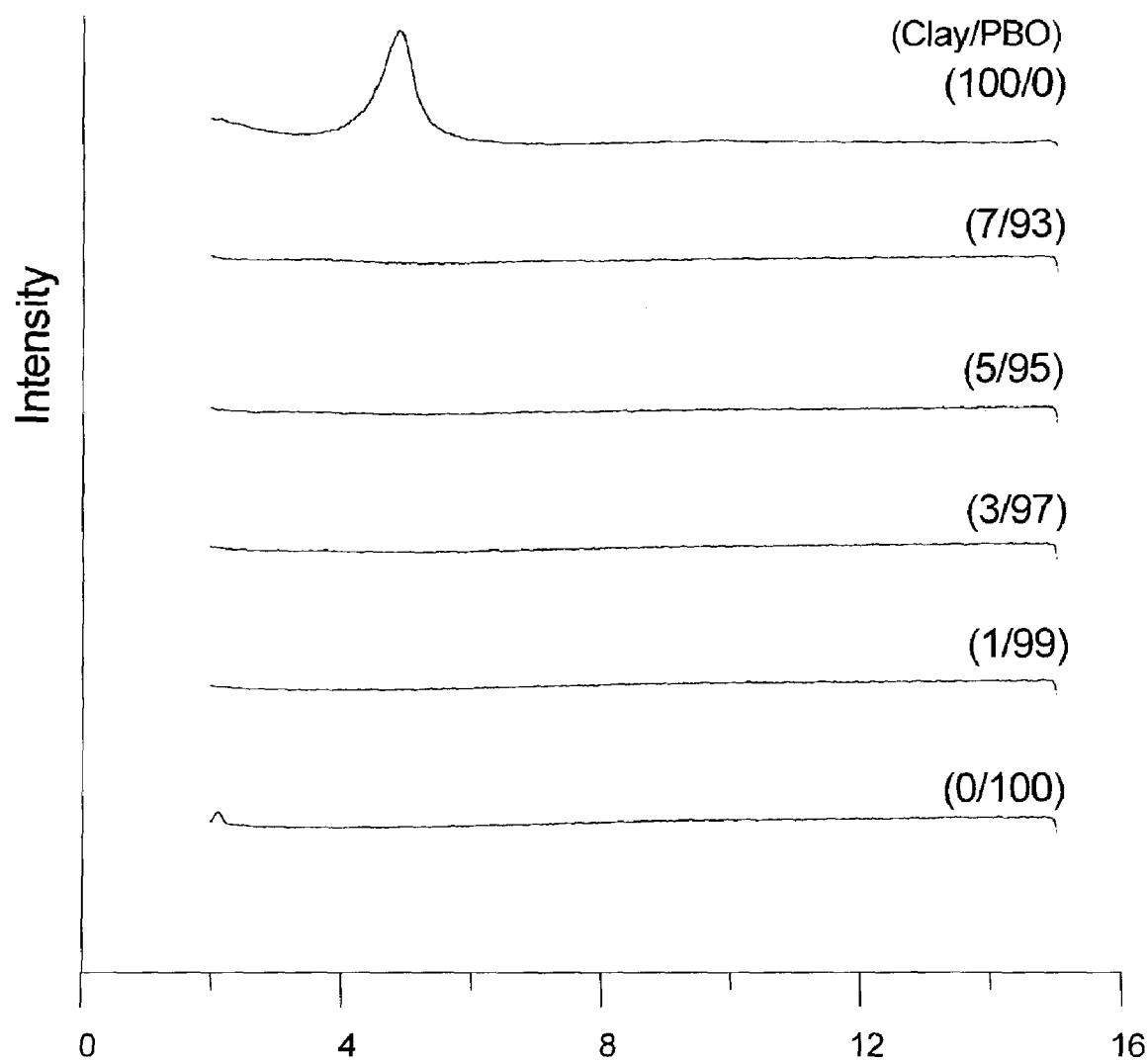
FIG. 6 illustrates the X-ray diffraction spectra for the PBO/clay composite materials formed with different amounts of the added clay.
Figure 7:
FIG. 7 is a transmission electron microscopy of an organoclay/PBO clay.

The x-ray diffraction curves of PBO/clay composite material with different amounts of clay in the composite are shown in FIG. 6. Within the region of 2θ=2~10°, no peak is generated, which confirmed that this PBO/clay composite material is an exfoliated nanocomposite. Observation through Transmission Electron Microscopy (TEM), as shown in FIG. 7, further confirms that the added clay is nano-dispersed in the PBO matrix.

The PBO/clay composite formed according to the present invention also possesses other attributes.

Using an extension probe on Thermal Mechanical Analyser (TMA), the x-y in-plane thermal expansion coefficients of the PBO/clay thin films with different clay loading are measured and summarized in Table 1. The thermal mechanical analysis is performed in a nitrogen ambient and with a heating rate of 5° C./minute.

TABLE 1

| Additive Amount (%) | 0 | 1 | 3 | 5 | 7 |
|---|---|---|---|---|---|
| Thermal Expansion Coefficient (μm/m° C.) | 48.3 | 44.6 | 43.5 | 39.9 | 38.3 |

As shown in Table 1, the thermal expansion coefficient increases as the amount of clay decreases. For example, the x-y axis in-plane thermal expansion coefficient is reduced by about 21% compared to the pure PBO film when 7 weight % clay was added. Therefore, it can be concluded that adding and dispersing a small amount of organoclay in a PBO matrix in a nanometer scale definitely reduces the thermal expansion coefficient of PBO.

Further, the addition of organoclay can also increase the thermal stability of PBO. The thermal stability of PBO/clay nanocomposites with different amounts of added clay was studied by TGA (Thermogravimetric Analyzer) under nitrogen. The thermal decomposition temperatures (5% weight loss temperature) are shown in Table 2.

TABLE 2

| Additive Amount (%) | 0 | 1 | 3 | 5 | 7 |
|---|---|---|---|---|---|
| Thermal Decomposition Temperature (° C.) | 513 | 517 | 519 | 522 | 525 |

As shown in Table 2, the thermal decomposition temperature increases as the amount of added clay increases. When 7% weight of clay is added, the thermal decomposition temperature is increased by about 12° C.

The glass transition temperature (Tg) of the PBO/clay composite material was measured by a Differential Scanning Calorimeter (DSC) in nitrogen at a heating rate of 20° C. per minute. As summarized in Table 3, the Tg also increases as the amount of the added clay increases.

TABLE 3

| Additive Amount (%) | 0 | 1 | 3 | 5 | 7 |
|---|---|---|---|---|---|
| Glass Transition Temperature (° C.) | 314 | 320 | 325 | 329 | 330 |

As shown in Table 3, the glass transition temperature Tg increased by about 16° C. when 7 weight percent of clay added in the PBO/clay composite material.

According to the fabrication method of the present invention, organoclay is nano-dispersed in the PBO matrix. Due to the high surface to volume ratio of the nano-dispersed clay, thermal expansion and contraction of polymer molecules are highly limited. The thermal expansion coefficient of the polymer molecules can thus be effectively lowered.

Further, the PBO matrix formed according to the present invention combines the low moisture absorption and low dielectric constant properties of a PBO material with a high reinforcement effect of a nanocomposite material to generate high quality and functional polymer material for used in the microelectronic industry.

Based on the various experiments conducted on a PBO/clay composite material, it is confirmed that the thermal decomposition temperature and the glass transition temperature increase as the amount of the added clay increases. The thermal stability of the PBO/clay composite material thus increases.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a polybenzoxazole (PBO)-clay nanocomposite, comprising:
   providing an organic amine type modifying agent and a layered clay to perform an ion exchange reaction to form an organoclay, wherein the organic amine type modifying agent is phenoxyaniline or 12-aminododecanoic acid;
   providing a diacid chloride and a bis(o-aminophenol) monomer to perform a polycondensation reaction to form a polyhydroxyamide (PHA) as a PBO precursor;
   mixing a fixed ratio of the organoclay with the PBO precursor; and
   performing a high temperature cyclization reaction of the organoclay and the PBO precursor to obtain the polybenzoxazole (PBO)-clay nanocomposite.

2. The method of claim 1, wherein the fixed ratio is about 0.001 to about 0.5.

3. The method of claim 1, wherein the fixed ratio is about 0.01 to about 0.1.

4. The method of claim 1, wherein a solvent used in the polycondensation reaction comprises N-methyl-2 pyrrolidinone (NMP).

5. The method of claim 1, wherein a solvent used in the polycondensation reaction comprises a polar solvent.

6. The method of claim 1, wherein an inherent viscosity of the PBO precursor is about 0.1 dL/gm to about 3.0 dL/gm.

7. The method of claim 1, wherein mixing the fixed ratio of the organoclay with the PBO precursor further comprises dissolving the PBO precursor in a dimethyl acetamide solvent to form a polymer solution.

8. The method of claim 1, wherein mixing the fixed ratio of the organoclay with the PBO precursor further comprises dispersing the organoclay in a dimethyl acetamide solvent.

9. The method of claim 1, wherein mixing the fixed ratio of the organoclay with the PBO precursor further comprises dispersing the organoclay and the PBO precursor in a polar solvent.

10. The method of claim 1, wherein mixing a fixed ratio of organoclay with the PBO precursor further comprises performing a solution casting process to form a polyhydroxyamide/clay thin film.

11. The method of claim 1, wherein the bis(o-aminophenol) monomer comprises 2,2-bis(3-amino-4-hydroxyphenyl)hexafluoropropane.

12. The method of claim 1, wherein the bis(o-aminophenol) monomer comprises 3,3'-dihydroxy-benzidine and 3-3'-diamino-4,4'-dihydroxy biphenyl.

13. The method of claim 1, wherein the diacid chloride comprises isophthaloyl chloride.

14. The method of claim 1, wherein the diacid chloride comprises terephthaloyl chloride.

15. The method of claim 1, wherein the diacid chloride comprises 4,4'-oxy-dibenzoylchloride.

16. The method of claim 1, wherein layered clay comprises Na+-montmorillonite.

17. The method of claim 1, wherein the layered clay comprises saponite.

18. The method of claim 1, wherein the layered clay comprises mica.

19. The method of claim 1, wherein the method further comprises adding polyamide.

20. The method of claim 1, wherein the method further comprises adding polyimide.

21. The method of claim 1, wherein the method further comprises adding an anti-static agent.

22. The method of claim 1, wherein the method further comprises adding a colorant.

23. The method of claim 1, wherein the high temperature cyclization reaction is performed at about 350° C.

24. The method of claim 1, wherein the obtained polybenzoxazole (PBO)-clay nanocomposite has a thermal expansion coefficient equal to or lower than 44.6 μm/m° C., a thermal decomposition temperature equal to or higher than 517° C., and a glass transition temperature equal to or higher than 320° C.

25. A method for fabricating a polybeuzoxazole (PBO)-clay nanocomposite, comprising:
   providing an organic amine type modifying agent and a layered clay to perform an ion exchange reaction to form an organoclay, wherein the organic amine type modifying agent is phenoxyaniline;
   providing a diacid chloride and a bis(o-aminophenol) monomer to perform a polycondensation reaction to form a PBO precursor;
   mixing a fixed ratio of the organoclay with the PBO precursor; and
   performing a high temperature cyclization reaction.

* * * * *